United States Patent [19]

Suzuki et al.

[11] 4,315,201

[45] Feb. 9, 1982

[54] ALIGNMENT APPARATUS FOR MASK AND WAFER USED IN MANUFACTURING SEMICONDUCTOR CIRCUIT ELEMENTS

[75] Inventors: Akiyoshi Suzuki, Tokyo; Ryozo Hiraga, Yokohama; Ichiro Kano, Yokohama; Hideki Yoshinari, Yokohama; Masao Totsuka, Ohmiya; Yuzo Kato, Yokohama; Yasuo Ogino, Yokohama, all of Japan

[73] Assignee: Canon Kabushiki Kaisha, Tokyo, Japan

[21] Appl. No.: 884,534

[22] Filed: Mar. 8, 1978

[30] Foreign Application Priority Data

Mar. 10, 1977 [JP] Japan .................................. 54/26304

[51] Int. Cl.$^3$ ................................................. G05B 1/06
[52] U.S. Cl. .................................... 318/640; 356/400; 356/401; 250/557
[58] Field of Search ................ 313/640; 356/110, 363, 356/399, 400, 401; 250/557, 561, 571

[56] References Cited

U.S. PATENT DOCUMENTS 3,943,359 3/1976 Matsumoto et al. ................ 318/640
3,955,072 5/1976 Johannsmeier et al. ............ 318/640

OTHER PUBLICATIONS

Khoury, "Analog Automatic Wafer Alignment for Fine Positioning", *IBM Technical Disclosure Bulletin*, Mar. 1975, p. 2895.

*Primary Examiner*—R. L. Moses
*Assistant Examiner*—Eugene S. Indyk
*Attorney, Agent, or Firm*—Fitzpatrick, Cella, Harper & Scinto

[57] ABSTRACT

An alignment apparatus for mask and wafer each having alignment marks provided in a narrow strip like area between circuit patterns is disclosed, which mask and wafer are used in manufacturing semiconductor circuit elements. In the apparatus, the mask and wafer are scanned to obtain scan signals by means of which the amount of relative deviation between the alignment marks on mask and wafer is detected. By means of the detected signal, an alignment is effected between the mask and wafer in the apparatus. For this type of alignment apparatus, there is a problem that since the alignment marks are provided in the narrow strip like area, no coincidence between the scanning position and the strip area is attainable with pre-alignment accuracy. Improvement in the alignment apparatus according to the invention lies in that a reading of alignment marks is initiated after the coincidence is photoelectrically detected.

6 Claims, 24 Drawing Figures

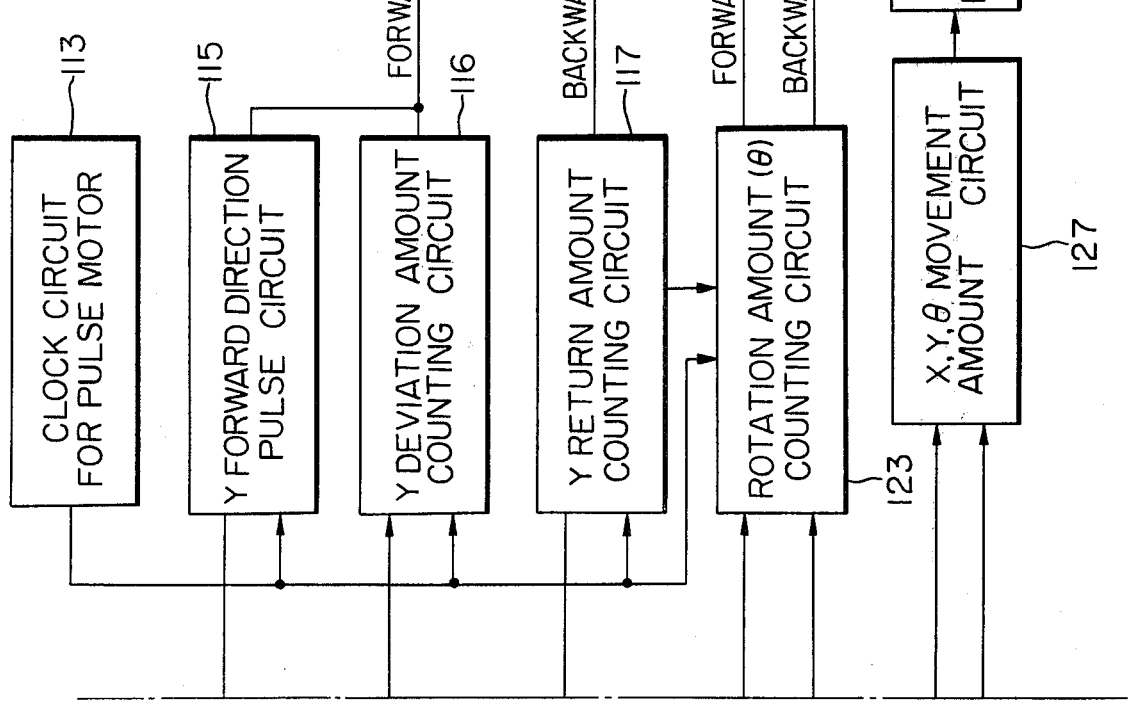

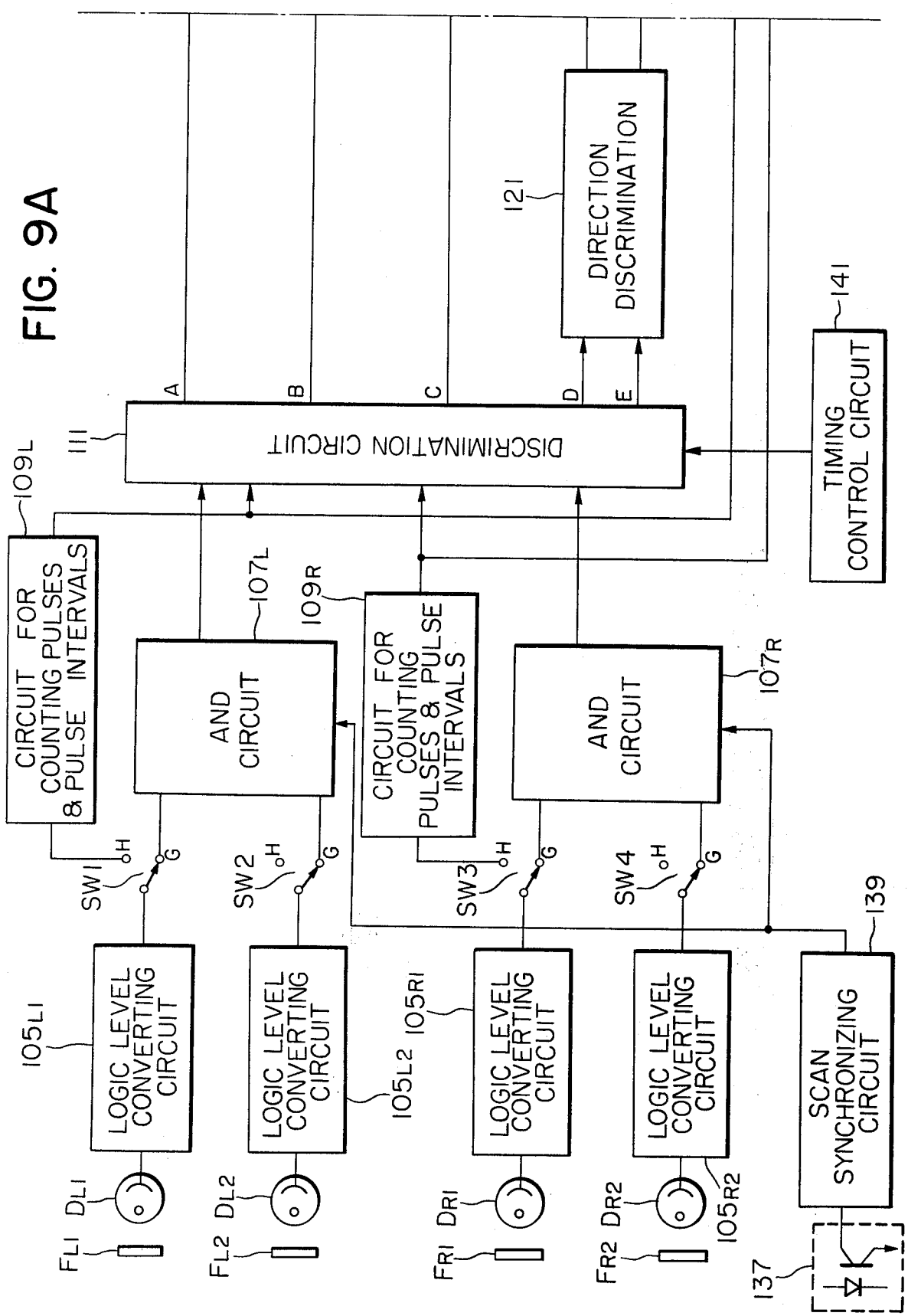

$$\Delta x_L = \frac{W_1 - W_2 - W_4 + W_5}{4}$$

$$\Delta y_L = \frac{-W_1 + W_2 - W_4 + W_5}{4}$$

FIG. 11　　FILTER FL1 (FR1)　　FILTER FL2 (FR2)
 
(i) ALIGNMENT MARK (SCRIBED AREA)
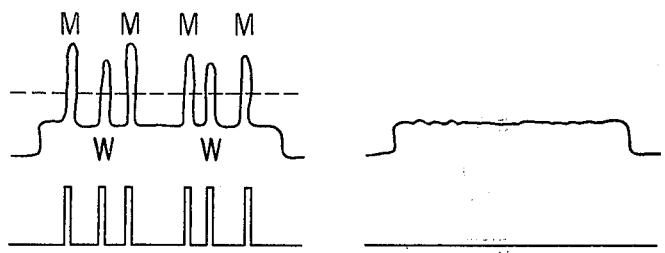
(ii) ONLY ORTHOGONAL COMPONENTS OF CIRCUIT PATTERN
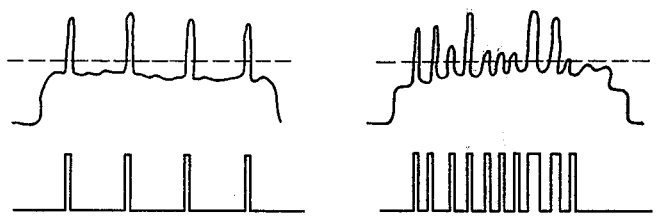
(iii) ORTHOGONAL & 45° COMPONENTS OF CIRCUIT PATTERN
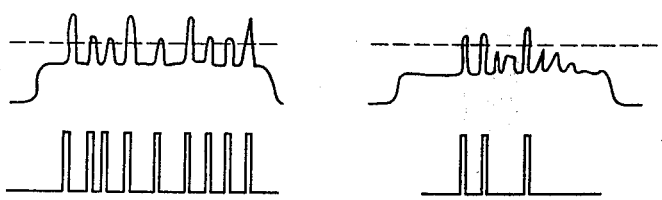
(iv) BLANK PORTIONS OF CIRCUIT PATTERN
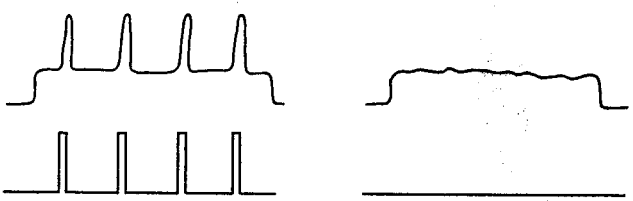
SCAN SYNCHRONIZING SIGNAL

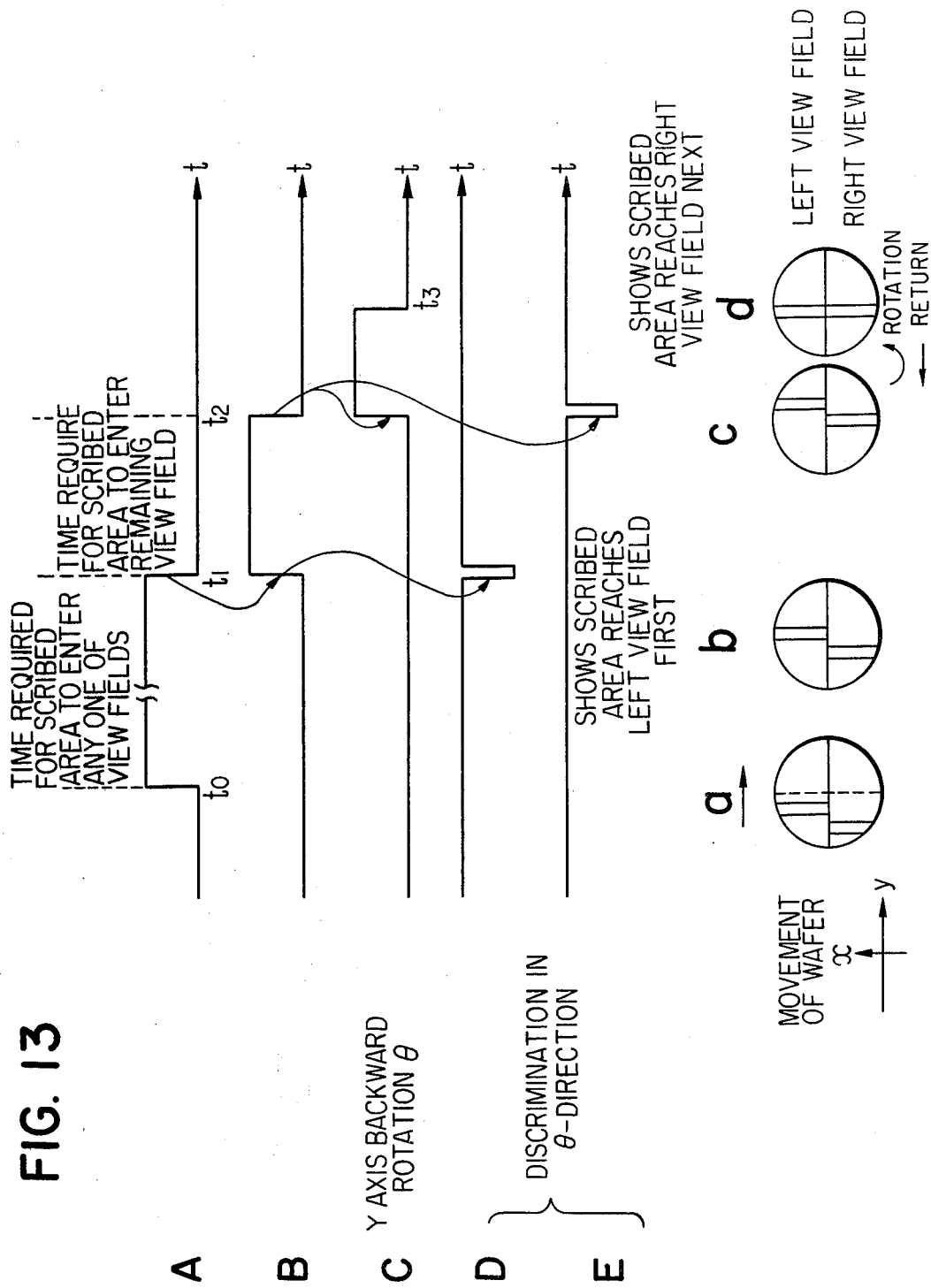

AMOUNT OF ROTATION $\theta = \dfrac{y}{l}$

AMOUNT OF Y DRIVE RETURN $Y_B = \dfrac{y}{2}$

FIG. 15

| SCAN POSITION | FILTER $F_{L1}(F_{R1})$ ⊗ | | FILTER $F_{L2}(F_{R2})$ ⊗ | |
|---|---|---|---|---|
| | SIGNALS | NUMBER OF PULSES | SIGNALS | NUMBER OF PULSES |
| ALIGNMENT MARK ON SCRIBED AREA | YES | 5~6 | NO | 0 |
| CIRCUIT PATTERN, ONLY ORTHOGONAL COMPONENTS | YES | 4 | YES | INDEFINITE |
| CIRCUIT PATTERN, INCLUDING 45° COMPONENTS | YES | INDEFINITE NOT LESS THAN 4 | YES | INDEFINITE |
| CIRCUIT PATTERN BLANK PORTION | YES | 4 | NO | 0 |

ALIGNMENT APPARATUS FOR MASK AND WAFER USED IN MANUFACTURING SEMICONDUCTOR CIRCUIT ELEMENTS

BACKGROUND OF THE INVENTION

1. Field of the Invention

The present invention relates to apparatus for aligning mask and wafer used in manufacturing semiconductor circuit elements in a predetermined positional relation.

2. Description of the Prior Art

In manufacturing IC, LSI, VLSI and the like, there is employed usually a method in which a plural number of masks each having circuit patterns thereon are used so as to print the patterns successively on a wafer. To carry out this known method it is absolutely necessary to bring the circuit pattern already printed on the wafer and a circuit pattern next to be printed on it into a predetermined, aligned relation. For this purpose, an alignment apparatus is used which moves one of the mask and wafer relative to the other to establish a desired alignment between the circuit pattern on the mask and that on the wafer.

In the alignment apparatus conventionally used hitherto, the wafer is supported movably relative to the mask and the operator adjusts the relative position between the wafer and the mask while observing the pattern on the former and that on the latter through a microscope.

Also, such type of automatic alignment apparatus has been known in which use is made of mask and wafer each having alignment marks provided thereon and these alignment marks are scanned to photoelectrically read out the alignment marks. During scanning there is detected the amount of deviation between the mark on the mask and that on the wafer, by means of which the wafer is moved in x,y and $\theta$ directions for alignment.

When alignment marks are provided in an area between circuit patterns, a more effective use of surface area is allowed for both mask and wafer. Such improved type of mask and wafer are disclosed in U.S. Pat. No. 3,796,497.

In a preferred embodiment of the invention, alignment marks are provided in a narrow strip like area of 100 $\mu$m on mask and wafer and the diameter of beam spot used in scanning the alignment mark is in a order of 10 $\mu$m. In this case, the scanning line, that is, the position on which the beam spot impinges should be exactly coincident with the narrow strip area. It is a common practice in the art to feed wafers to the alignment apparatus after carrying out a pre-alignment for them by an automatic feeding apparatus. However, the automatic feeding apparatus commonly used for this purpose is not sufficiently accurate to effect a coincidence of the narrow strip area and scanning line as mentioned above. So long as the coincidence is not established, no alignment operation is possible.

SUMMARY OF THE INVENTION

Accordingly, it is a principal object of the invention to provide an improved alignment apparatus which enables establishment the desired coincidence of the narrow strip area and the scanning line.

According to the present invention, the above and other objects are attained by moving at least one of the mask and wafer relative to the other in a direction orthogonal to the scanning line and discriminating, with the aid of signals obtained during the scanning, whether the scanning position is in the narrow strip area or not.

Other objects, features and advantages of the invention will appear more fully from the following description taken in connection with the accompanying drawings.

BRIEF DESCRIPTION OF THE DRAWINGS

FIGS. 9, 9A, and 9B are circuit diagrams showing a control circuit for driving motors shown in FIG. 5;

FIGS. 11 and 12 show various wave forms obtained in the apparatus;

FIG. 13 is a time chart of alignment operation according to the invention;

FIG. 15 shows various combinations of signals derived from the filters; and

DESCRIPTION OF THE PREFERRED EMBODIMENTS

Figure 1:
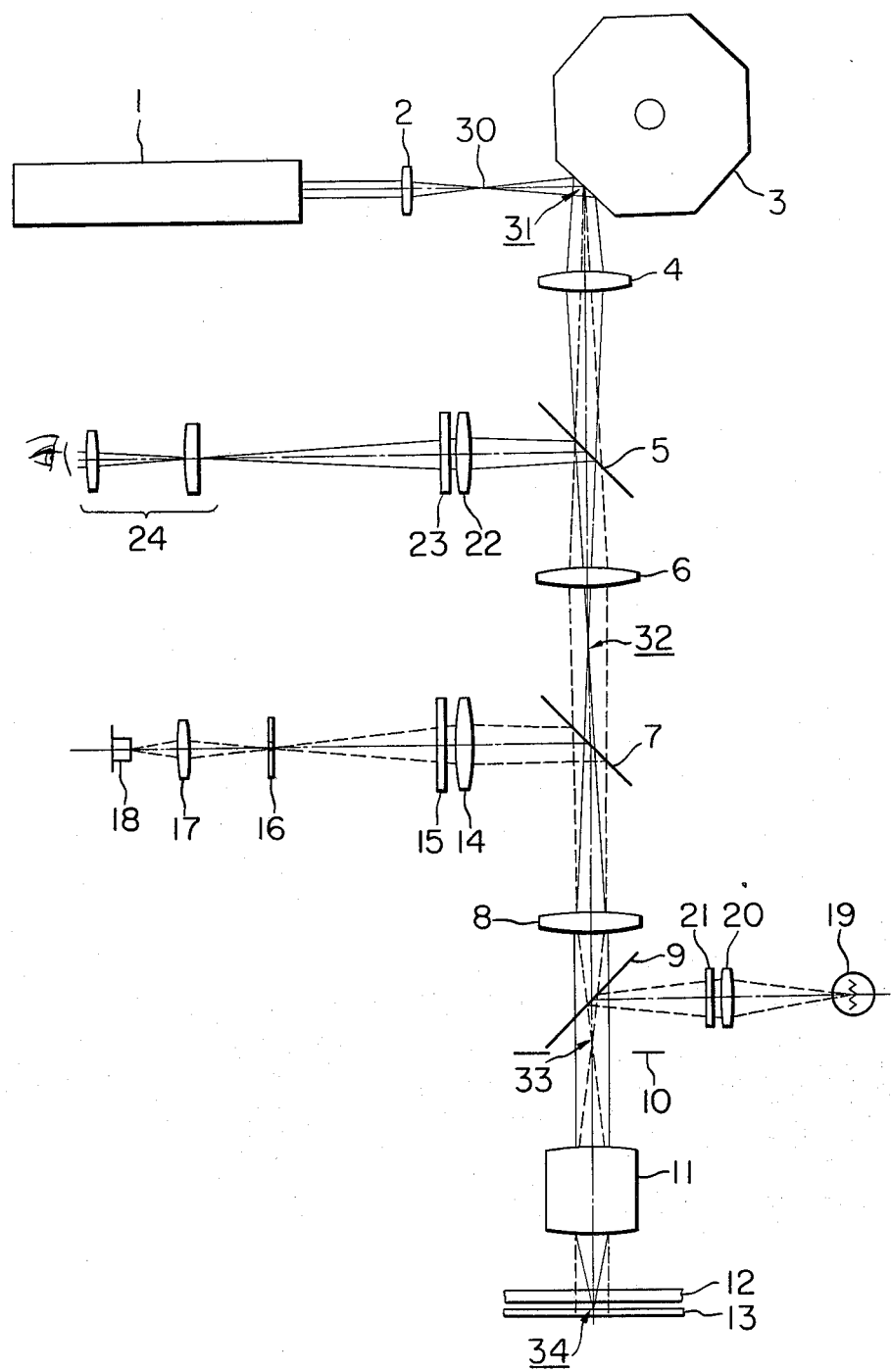
FIG. 1 illustrates an arrangement of photoelectric detecting system used in the apparatus of the invention.

FIG. 1 shows a scanning type photoelectric detecting optical system adopted in the apparatus of the present invention. This optical system is of the same type as disclosed in U.S. application Ser. No. 672,022, now U.S. Pat. No. 4,062,063, filed by applicants.

Referring to FIG. 1, the reference numeral 1 designates a laser light source, 2 is a condenser lens, 3 is a rotary polygon mirror and 4 is a relay lens. Designated by 5 is a beam splitter for directing a portion of the light beam to an optical system for visual observation designated by 22, 23 and 24. 6 is a field lens and 7 is a beam splitter by which the incident beam is divided into two portions, one of which is directed to a relay lens 8 and the other to a photoelectric detecting optical system designated by 14, 15 etc. 9 is also a beam splitter by which the light coming from an illumination optical system for visual observation designated by 19 through 21 is conducted. 10 is a pupil of an objective 11. Designated by 12 is a mask and 13 is a wafer.

To the mask and wafer, there are provided two arrays of the above described system, one for the right hand edge portion and the other for the left although only one is seen in the drawing. But, it is not always necessary to provide two systems which are completely separate from one another. For example, a polygon mirror may be used in common for the two systems while the remaining elements are provided separately.

The laser beam emitted from the source 1 is temporarily condensed at 30 by the condenser lens 2. The spot diameter of the condensed laser light at 30 is determined by the diameter D of laser beam incident upon the condenser lens and the focal length $f_2$ thereof. Assuming that the distribution of the laser light in the diameter D is uniform, the diameter of the laser spot at 30 is given by $$d = 2.44 \lambda f_2 / d$$

The laser beam diverging from the point 30 is reflected by the rotary polygon mirror 3 to the relay lens 4 and after passing through the relay lens 4 and the field lens 6 the beam is temporarily focused at the point 32 in the vicinity of the field lens. Thereafter, it is finally focused at the point 34 on a plane corresponding to the surface of the mask 12 and the wafer 13 through the relay lens 8 and the objective 10.

As will be understood from the foregoing, three planes 30, 32 and 34 in FIG. 1 are conjugate to each other. The diameter $\phi$ of the beam spot by which the surfaces of the mask 12 and the wafer 13 are actually scanned, is given by $$\phi = ad$$

wherein a is focussing magnification of the lenses 30 through 34. Therefore, the diameter of the scanning spot may be changed as desired by changing the value of d, which can be realized by changing the beam diameter D of laser light and/or the focal length $f_2$ of lens 2. When it is desired only to enlarge the scanning spot, this may be attained in a simple manner by displacing the condenser lens 2 and defocussing the laser beam at 30. It is generally desirable that the diameter of scanning spot can be selected suitably in accordance with the line width of pattern to be scanned. In view of this point, the system illustrated in FIG. 1 is advantageous since it allows an easy change of the spot diameter. The laser beam focused at 34 scans the surfaces of the mask and the wafer as the rotary polygon mirror 3 rotates.

Here, explanation will be made as to focussing of the pupil of the optical system shown in FIG. 1.

The pupil of the objective 11 is designated by 10 as mentioned above. The center 33 of the pupil 10 lying on the optical axis and the reflection point 31 on the rotary polygon mirror are conjugate to each other. In other words, as far as the incidence of laser beam on the objective is concerned, the arrangement of FIG. 1 is considered to be equivalent to an arrangement in which the rotary polygon mirror is disposed at the position of the pupil 10.

Figure 2:
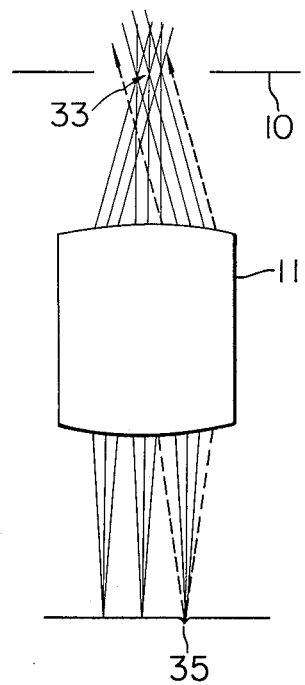
FIG. 2 shows the focusing lens portion in FIG. 1 in detail for explanation.

For an observation of a reflective object such as a wafer there is used an objective lens that is telecentric. The objective 11 shown in FIG. 1 is telecentrically arranged. Namely, at the focal point of object space of the objective 11 there is positioned the pupil 10 which determines the beam passing through the optical system. This is clearly seen in FIG. 2. Referring to FIG. 2, there is shown rays of laser light incident upon and exiting from the objective 11. As previously described, the center 33 of the pupil 10 that is the focal point of object space of the objective 11 is conjugate to the reflection point 31 of laser beam on the rotary polygon mirror 3. Therefore, the center of the pupil functions as if it emits a scanning beam. As can be seen best in FIG. 2, the principal ray that becomes the center line of the scanning beam passes through the focal point of object space of the objective 11 and therefore it becomes parallel to the optical axis after passing through the objective so that it is incident upon the mask and wafer perpendicularly. When the scanning beam falls on a flat portion of the scanned subject, the incident beam is reflected thereby to return to the focal point of object space 33. On the contrary, if the incident scanning beam falls upon a pattern, then the beam will be scattered by the boundary edge portion of the pattern so that it can not return to the focal point of object space. The scattered light taken up in the objective 11 no longer passes through the center 33 of the pupil 10 but passes through an area of the pupil outside of the center. This means that scattered light and non-scattered light are spatially separated from one another on the pupil.

The manner of separating the scattered light from the non-scattered light on the pupil is illustrated in FIG. 2. Assumed that the scanning beam is now scanning the surface of the subject from left to right continuously, the scanning beam can not be subjected to scattering until it falls upon the position 35 where a pattern exists. Therefore, before reaching the pattern the scanning beam of laser light is reflected to the original position in the pupil 10. When it falls upon the pattern 35, the scanning beam is scattered and it is returned along a path as suggested by the dotted lines in the drawing without passing through the original position in the pupil 10. The area which the non-scattered light covers at the pupil 10 is equal to the effective diameter of the scanning laser beam. In order to effectively take up the scattered light, the effective diameter of the non-scattered light beam is usually determined sufficiently small as compared with the diameter of the pupil. It is generally preferable that the ratio of the former to the latter in diameter is in the range of from 0.1 to 0.7.

Referring again to FIG. 1, an explanation will be made of the photoelectric detecting optical system branched at the beam splitter 7 and extending to a photo-detector 18.

In FIG. 1, the reference numeral 14 designates a lens for focussing the pupil 10 of the objective 11 and the reference numeral 15 designates a filter which transmits the light used for photoelectric detection but essentially cuts off light of other wavelength such as that used in the optical system for visual observation. Designated by 16 is a position at which an image of the pupil 10 is formed by the pupil focussing lens 14. At this position there is disposed a screening plate 16 which transmits solely the scattered light and cuts off the non-scattered light. The scattered light transmitted through the plate 16 is again condensed by a condenser lens 17 and the condensed light beam then enters the photo-detector 18. The pupil 10, the screening plate 16 and the photo-detector 18 are in a relation of conjugation. The screen plate may be made easily by providing a center pattern of metal and the like on a glass substrate. In the photoelectric detecting system there is produced an output only when the scanning spot comes to enter the edge portion of the pattern on the subject scanned thereby. Therefore, by observing the output relative to time man can perceive the issuance of a pulsed signal when the scanning beam impinges upon the edges of the mask 12 and the wafer 13. Based upon this detection, an automatic alignment can be effected by adjusting the relative position between the wafer and the mask employing a driving mechanism not shown.

For the purpose of visual observation, there are provided an illuminating system 19 through 21 and an observation system 22 through 24. 19 is a light source for illumination and 20 is a condenser lens serving to form an image of the light source on the pupil 10 of the objective 11. Designated by 21 is a filter which cuts off light in such a wavelength range to which a photoresist is sensitive. 22 is an erector for erecting an image and 23 is a filter which cuts off laser wavelength and transmits wavelength used for visual observation. 24 is an eyepiece.

Now, referring to FIGS. 3 and 4 an explanation of alignment mark will be made.

Figure 3:
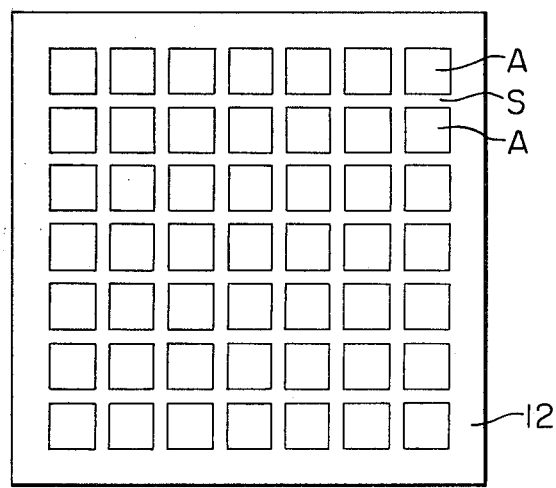
FIG. 3 shows one example of a mask.

FIG. 3 shows one example of mask 12. Designated by A is an area where a circuit pattern is to be formed. On the mask, there are a great plurality of such areas A spaced by the area S where no circuit pattern is to be formed. Each of the areas S is in a form of narrow strip. In case of the wafer, it is cut into a large number of chips along the scribed lines finally formed in these narrow strip portions S.

In the narrow strip area S, the mask has alignment marks which are formed during the time of the circuit pattern being printed on the mask. For a whole surface printing, there are provided two alignment marks, one at the left side and the other at the right side. For a n-stepped printing, the corresponding number of alignment marks are printed one for each the area A at the upper marginal portion thereof simultaneously with the printing of the circuit pattern.

Figure 4:
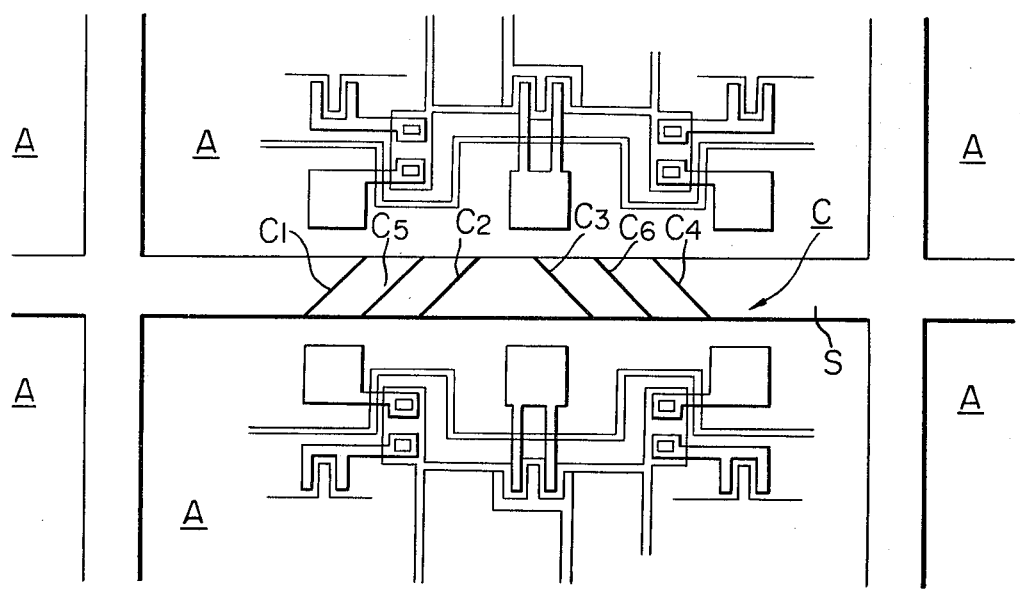
FIG. 4 shows a portion of the mask according to the invention.

FIG. 4 shows alignment marks thus formed which are on a scribed line between two areas A and A and which are generally designated by C. In the drawing of FIG. 4, the mask and the wafer are seen at the same time in an aligned position. Alignment marks $c_1$–$c_4$ belong to the wafer and $c_5$ and $c_6$ to the mask which are in a predetermined position of alignment. The scanning beam spot in the optical system shown in FIG. 1 reads the alignment mark C while moving from left to right as viewed in the drawing of FIG. 4.

Figure 5:
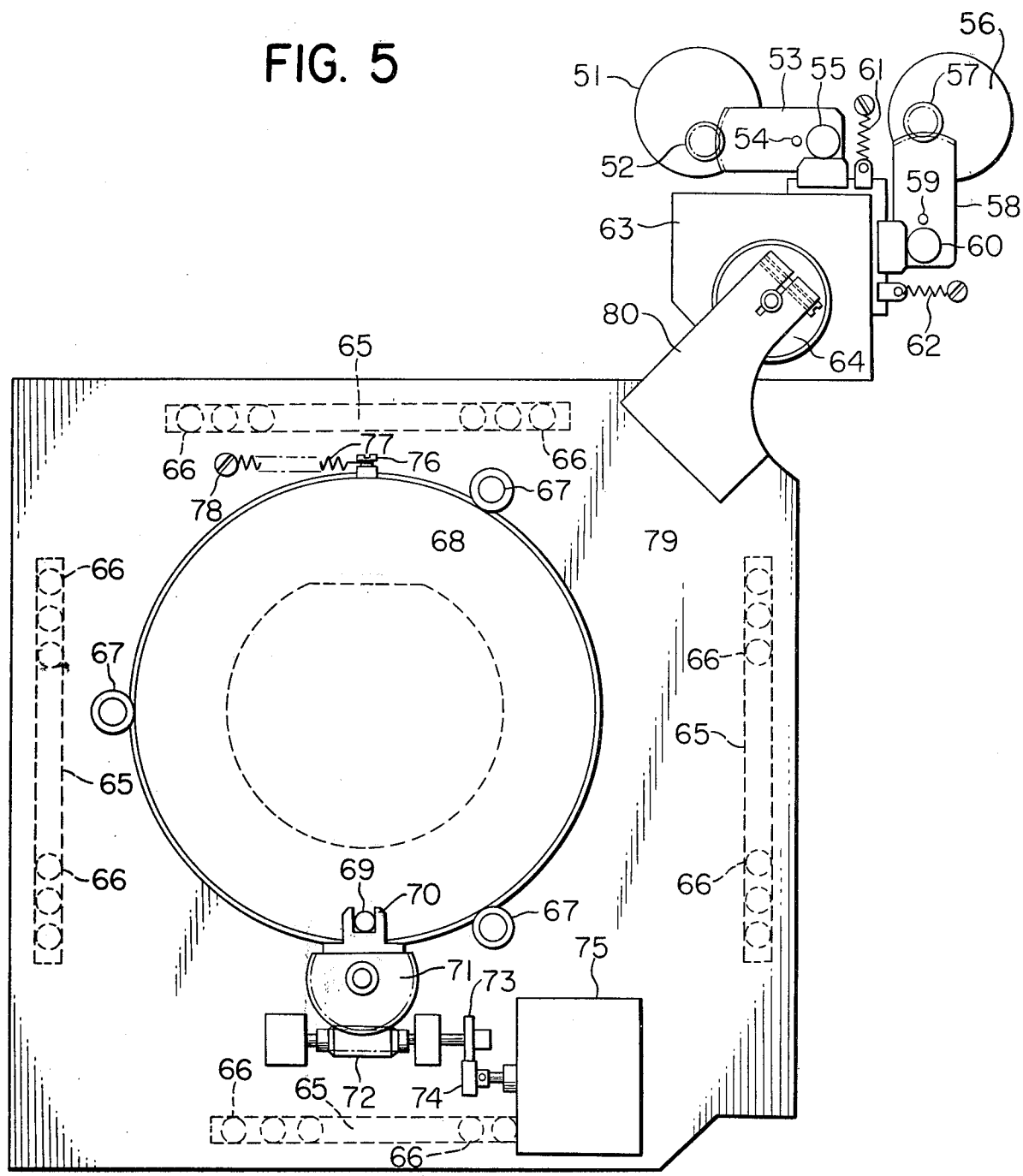
FIG. 5 shows a mechanism used for translational movement of the wafer.

FIG. 5 illustrates a driving unit for moving the wafer to establish the desired positional relation of alignment between the wafer and the mask. For this type of alignment, it is a common practice in the art to set the wafer movably while fixing the mask. For this reason, also the apparatus of the present invention is designed as of the same type in which a mask is positioned stationary relative to the optical system and a wafer is movable relative to the fixed mask for alignment.

In the driving unit shown in FIG. 5, pulse motors are used to cause a parallel movement in the direction of X and Y axes and a rotational movement of $\theta$. To this end, the unit comprises two sections, that is, a parallel movement drive section containing elements designated by 51–64 and a $\theta$ drive section containing those elements as mounted on a stage 76.

The parallel movement drive section includes two pulse motors, that is, motor 51 for Y-drive and motor 56 for X-drive. To these pulse motors 51 and 56 there is delivered an input in a form of a driving pulse number which is produced by processing the signal obtained by the above described optical system. Gears 52 and 57 are directly connected with the shafts of the pulse motors 51 and 56 respectively. Operatively engaged with the gears there are provided geared levers 53 and 58 which are rotatable about the pivot pins 54 and 59 respectively so as to move a sub-stage for X-Y parallel movement through rollers 55 and 60. In this manner, the sub-stage 63 is driven by means of a driving signal for parallel movement received by the pulse motors. Designated by 64 is a vacuum clutch with which a switching over is carried out from manual operation to automatic alignment operation and vice versa. For automatic alignment operation, the clutch 64 is locked so as to transmit the driving signal for X-Y movement to the main driving stage 79 through an arm 80. Under the stage 79 there are provided slots 65 serving as a guide for driving. Each slot 65 has bearings 66 enclosed therein. With the aid of this guide, the driving motion of the X and Y pulse motors 56 and 51 is accurately transmitted to the stage. The stage 79 further includes a $\theta$ driving stage 68 incorporated therein. The stage 68 is so designed that a wafer sucking chuck and a wafer are laid thereon and the wafer is moved. A wafer placed on the stage is suggested by a dotted line within the circle of the stage in FIG. 5. The translational motion or parallel movement of the stage 68 is limited by three rollers 77 distributed on the main stage 79 around the $\theta$ driving stage 68. A pulse motor for $\theta$ drive is indicated by 75 which is hereinafter referred to simply as $\theta$ motor. A gear 74 connected with the shaft of the motor drives rotationally a gear 71 through a gear 73 and a worm gear 72. The gear 71 has a guide 70 in which a pin 69 extending from the stage 68 is fitted. By moving the pin 69 held in the guide, a rotation of the stage 68 is effected to adjust the wafer on it.

As will be understood from the foregoing, according to the above described embodiment, the aimed driving in X, Y and $\theta$ is realized by mounting a $\theta$ motor on a stage for X-Y driving.

Feeding of the wafer to the stage 68 is effected in a manner known per se by a well known pre-alignment apparatus employing a photo-diode which is also known. At this wafer feeding step, it is absolutely necessary that the scanning line formed by the optical system of FIG. 1 and the scribed line be positionally coincident one to another. However, this coincidence is very difficult to attain even with a high accurate pre-alignment apparatus because the scribed line is in an order of 100 $\mu$m and the diameter of the laser spot is of 10 $\mu$m. So long as the coincidence between the scribed line and the scanning line is not obtained, it is impossible to read out the alignment mark.

To solve the problem according to the shown embodiment, the stage 68 is moved in a direction orthogonal to the scanning line while scanning the wafer by the beam spot and the scan signal derived therefrom is used to detect the coincidence between the scribed line and the scanning line. As previously described, in this embodiment, the mask is fixed and therefore the coincidence between the scanning line and the scribed line of the mask can be established preliminarily.

The manner of detecting the scribed line of the wafer is as follows:

Various methods may be used to detect the scribed line. For the sake of explanation, only one method is described herein as a representative of them in which the difference in pattern between circuit and alignment mark is made us of for the detection.

As will be seen best in FIG. 4, the most distinguished difference between the circuit pattern and the alignment mark is found in orientation of lines. The circuit pattern is constituted of many line segments which extend almost crosswise and lengthwise whereas the alignment marks $c_1$–$c_6$ extend at an angle of 45° relative to the line segments of the circuit pattern. This feature in orientation has a remarkable effect on diffusion of light in a pupil (FIG. 1; 33). The phenomenon previously described by using the term "scattering at edge portion" for the sake of explanation is nothing but a kind of diffraction phenomenon.

Figure 6A:
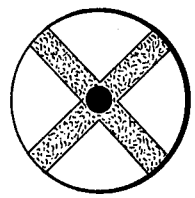
FIGS. 6A–6B illustrate various distributions of scattered lights on the pupil caused by alignment mark and circuit pattern.
Figure 6B:
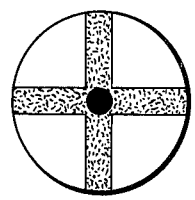

FIG. 6 illustrates the difference in mode of distribution of scattered lights caused by the difference in orientation mentioned above. In FIG. 6, the illustration (a) is a distribution of scattered light from the alignment mark area, (b) is a distribution of scattered light from the line segments in x-y direction of the circuit pattern and (c) shows a distribution of scattered light from the corner area of the circuit pattern. In each the case, there is a light point of high intensity owing to non-scattered light at the center. Surrounding the high intensity light point there is distributed scattered light. It is obviously seen that the distribution of scattered light varies depending upon the orientation of the pattern. The scattered light caused by the circuit pattern exhibits a distribution in x and y directions (b) and the scattered light caused by the alignment mark shows a distribution angled by 45°(a). Since the corner area of the pattern serves as a kind of point light source, the scattered light derived therefrom distributes over the whole area of the pupil (c).

According to this embodiment of the invention, the described line is detected making use of the above mentioned particular distributions which are different from each other.

Figure 7:
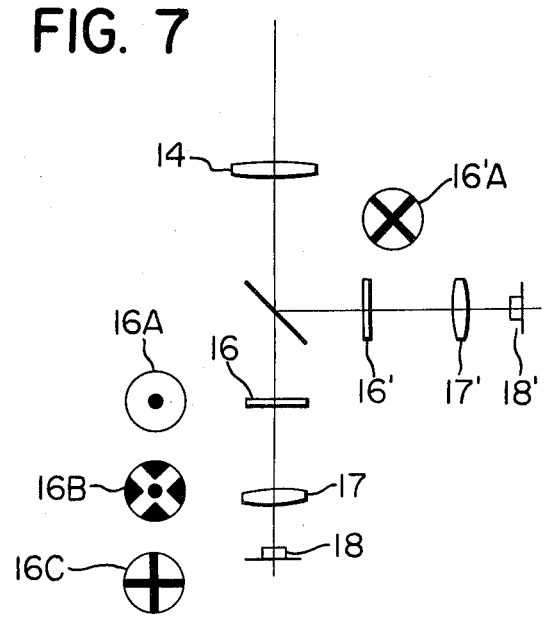
FIG. 7 shows an optical system used to distinguish the alignment mark from the circuit pattern.

FIG. 7 shows a concrete arrangement useful for this purpose. In the drawing of FIG. 7, only the photoelectric detecting optical system constituting a part of the apparatus shown in FIG. 1 is particularly shown again for the purpose of explanation. The important feature of the photoelectric detecting system used in this embodiment is found in that the detection is effected using two channels. The optical path is divided into two by a beam splitter interposed between the pupil focussing lens 14 and a screen plate 16. In each of the two channels formed by the division there is provided a screening plate to form a photoelectric detecting system respectively. These two channels are hereinafter referred to as A-channel and B-channel for the sake of explanation.

Provided that A-channel be used to take up the scattered signal light of an alignment mark lying in the scribed line, the channel is indicated by the system extending up to the photo-detector 18 in FIG. 7. The B-channel is indicated by another system extending up to 18' in FIG. 7.

Figure 6C:
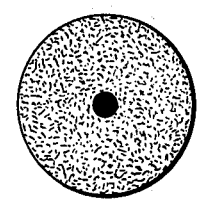

For A-channel, the screen plate 16 which may be called a filter, may have a shape such as 16A, 16B or 16C illustrated at the left hand side of FIG. 7 drawing, taking into consideration the distribution of light coming from the alignment mark (FIG. 6(A)). Namely, the plate 16 may be designed as such a filter which has a spot for filtering the non-scattered light off and which allows the transmission of the scattered light obliquely distributed. However, in case of 16A, the filter is unable to cut off the scattered light coming from the circuit pattern. The filter of 16B can reduce the scattered light coming from the circuit pattern to some extent but not cut it off completely. In particular, when the scanning beam scans the corner area of the circuit pattern it is impossible to screen off the scattered light which may have a distribution as shown in FIG. 6(C).

On the other hand, the filter 16' disposed in B-channel is of the type which cuts off the scattered light coming from the alignment mark completely. Since the alignment mark has a predetermined, very simple shape, it is entirely possible to define the distribution of the scattered light coming from the alignment mark. Therefore, the scattered light from the alignment mark, the distribution of which is shown in FIG. 6(A), can be shut out completely by providing a filter as illustrated by 16'A at the position 16'. Thus the photo-detector 18' in B-channel receives a signal derived from the circuit pattern.

From the above description, the functions of the channels A and B have become apparent. A-channel detects both the alignment mark and the circuit pattern whereas B-channel detects only the circuit pattern. The information obtained from such detection is useful for discriminating the scribed line from other when the wafer is moved for alignment.

Since the alignment marks provided on the subject mask is always scanned by the laser beam, the signal from the mask is always observed in each scanning. In B-channel which cuts off the signal of alignment mark, there is detected no signal derived from the mask. Assuming that a wafer enters the scanning area under the above condition, then there may be considered the following three cases:

(1) The scanning beam scans the circuit pattern formed on the wafer. In this case, a wafer signal will appear in both of the channels A and B.

(2) The scanning beam scans such area of the circuit pattern where a blank exists. In this case, a wafer signal will be detected neither in A-channel nor in B-channel.

(3) The scanning beam scans the scribed line. In this case, a wafer signal will appear only in A-channel whereas no output is observed in B-channel because of the presence of alignment marks within the scribed line.

As will be understood from the above, the scribed line can be ascertained by detecting the fact that a wafer output appears in A-channel only and there is no output in B-channel.

In order to conduct the detection of described line in this manner conveniently, it is preferable that at the time of pre-alignment, the wafer is somewhat offset intentionally from the proper pre-alignment position. By doing so, the operator can easily know the direction of initial drive for the wafer since the scribed line is offset constantly in a certain direction relative to the scanning line.

FIG. 8 illustrates one example of such detecting procedure. In FIG. 8, the one point broken line indicates the locus of scanning laser beam, the dotted line indicates alignment marks formed on the mask and the solid line indicates the scribed line on the wafer and alignment marks contained in the scribed line. The bisector of the circle is a view field dividing line. The mask and wafer must be aligned two-dimentionally. Therefore, in order to match the degree of freedom of X and Y for translational motion to the degree of freedom of $\theta$ for rotational motion, two different positions on the mask and wafer must be measured. To observe the two measuring positions at the same time, a so-called view field dividing method is commonly employed in which one half of one view field and one half of another view field are overlapped as seen in FIG. 8.

In the example shown in FIG. 8, the laser scanning line is orthogonal to the view field dividing line. Furthermore, the scribed line of the wafer is so set that in its pre-aligned position, the scribed line comes always in the view field at an area under the scanning line. While only the scribed line is shown in FIG. 8 as to the wafer, it should be understood that in addition to the scribed line there is, in practice, a circuit pattern on the wafer.

Figure 8A:
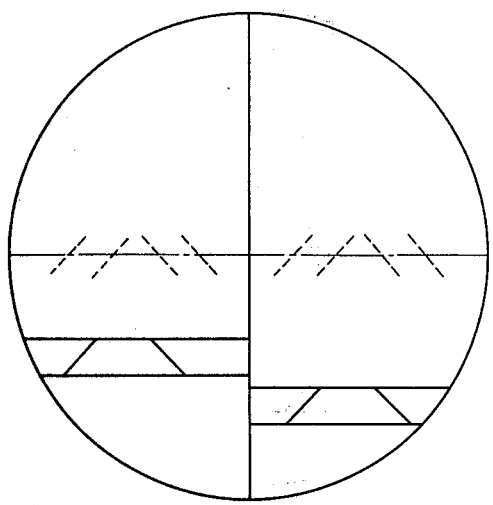
FIGS. 8A–8D illustrate a procedure of alignment observed through a microscope view field.
Figure 8B:
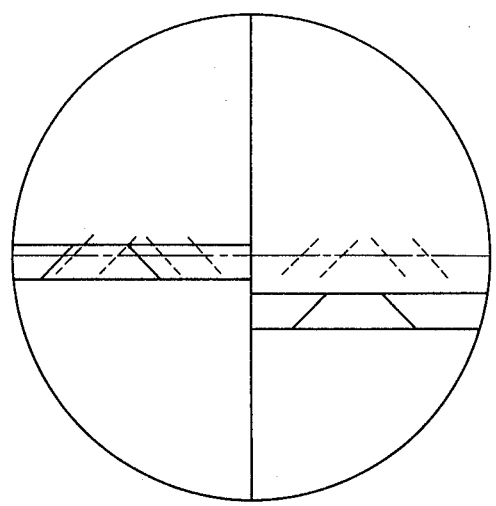
Figure 8C:
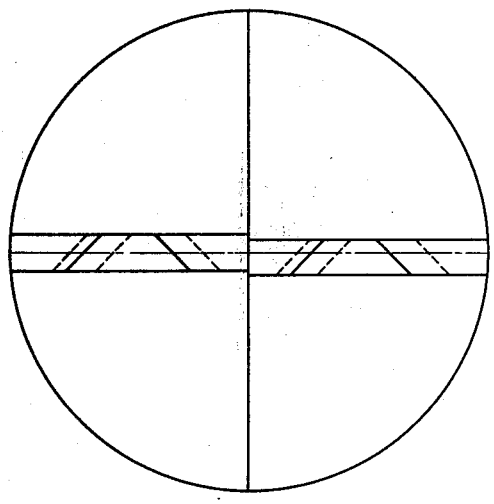
Figure 8D:
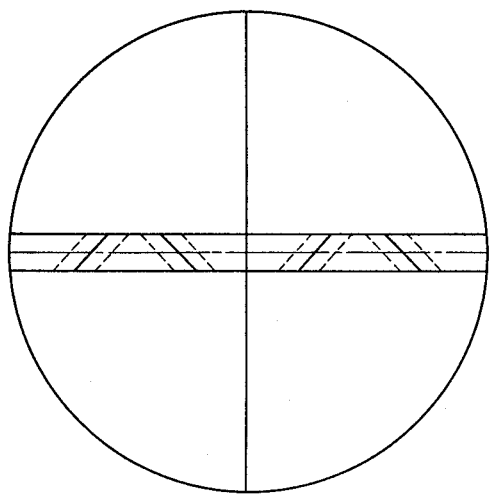

After setting the wafer which is then in a position downwardly offset, it is moved upwards as a first step of alignment by using Y-motor. During this upward movement, the operator continues checking the signals on both the channels A and B to monitor come-out of the condition under which the output of B-channel disappears and only A-channel puts out a wafer signal. In this manner, initially at the left side view field as viewed in FIG. 8 there occurs a coincidence between the scribed line and the scanning line as shown in FIG. 8(B). At this time point, an information informing of the detection of the scribed line is detected. A further upward feeding of the wafer makes the scribed line at the right side view field detected. The information informing of the detection of the scribed line in both the right and left view fields is used to drive Y-motor and $\theta$-motor so that the scanning line can be contained within the scribed line as shown in FIG. 8(C). In the position (C), there is obtained a signal derived from the alignment marks contained in the scribed line. The signal is used for final alignment the position of which is shown in FIG. 8(D).

Other various procedures may be employed for making a coincidence between the scribed line and the scanning line of the laser beam. For example, X-motor may be driven also before reaching the step (C) because the deviation amount in X-direction is detected and becomes known already in the step (B). Therefore, it should be understood that the procedure described above referring to FIG. 8 is only one example of various possible procedures.

FIG. 9 shows one embodiment of the control circuit used in the invention.

Figure 10:
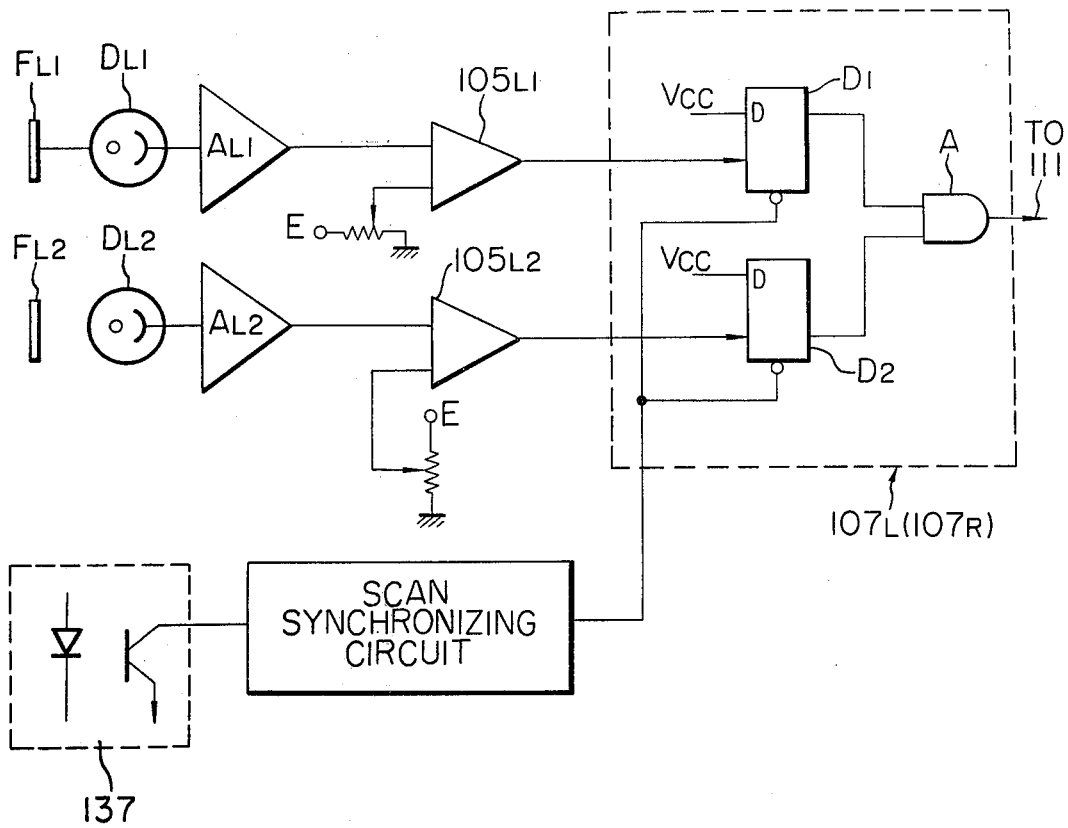
FIG. 10 shows the signal detection part of the control circuit shown in FIG. 9 in detail.
Figure 12:
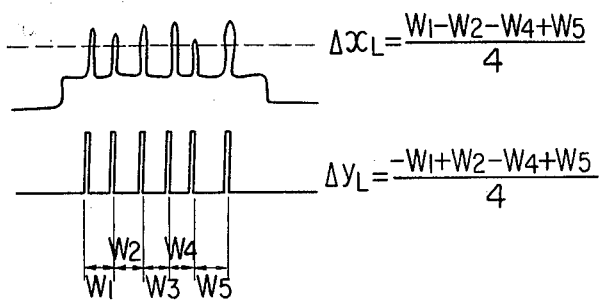

In the block diagram of FIG. 9, $F_{L1}$, $F_{L2}$, $F_{R1}$ and $F_{R2}$ correspond to the above described filters (screen plates) 16 and 16′. $D_{L1}$, $D_{L2}$, $D_{R1}$ and $D_{R2}$ are photoelectric transducers corresponding to the above described photo-diodes 18 and 18′, and $105_{L1}$, $105_{L2}$, $105_{R1}$ and $105_{R2}$ are logic level converting circuits by which an analog signal is converted into a logic level. The suffix "L" means that it belongs to the channel for the left side view field and "R" means that it belongs to the channel for the right hand view field. Similarly, the numerical suffix "1" means that it belongs to A-channel filter and also "2" means that it belongs to B-channel filter. In the same sense, $107_L$ and $107_R$ designate AND circuits which issue an output signal when signal from A-channel filter is present and signal from B-channel filter is absent. The AND circuit is further shown in FIG. 10 in detail. $109_L$ and $109_R$ are circuits for counting pulses and for counting pulse intervals so as to effect the alignment. The pulse number counting circuit and pulse interval counting circuit are provided for each of the right and left view field channels. 111 is a discrimination circuit which controls the pulse motor YM for driving in Y-axis direction and the pulse motor $\theta$M for driving in $\theta$-axis direction. 113 is a clock circuit for the pulse motor, which generates clocks used in stepped driving of the Y-axis driving pulse motor YM and the $\theta$-axis driving pulse motor $\theta$M. 115 is a Y forward direction pulse circuit, 116 is a Y deviation amount counting circuit, which counts the deviation amount of scribed line in the right and left view field, and 117 is a Y return amount counting circuit for use in returning Y-axis so that both the two view fields may come into the scribed area. 119 is a Y motor driving circuit, 121 is a direction discrimination circuit for determining the direction of $\theta$ drive, 123 is a rotation amount ($\theta$) counting circuit, 125 is a $\theta$ motor driving circuit and 127 is a X, Y, $\theta$ movement amount counting circuit by which, using the pulse interval ($W_1$–$W_5$ in FIG. 12), deviation amount in X, Y and $\theta$ is given for alignment. 129 is a X, Y and $\theta$ accurate position driving circuit for reducing the above given deviation up to zero. As already mentioned, YM, XM and $\theta$M designate pulse motors for X, Y and $\theta$ respectively. 137 is a light chopper for detecting scan synchronism and 139 is a scan synchronizing circuit for resetting AND circuits, pulse counting and pulse interval counting circuits and the like in synchronism with the scan. 141 is a timing control circuit for controlling the timing of a total sequence.

The manner of operation of the above described control circuit used in the invention is as follows:

At the time of pre-alignment, a wafer is set to a position somewhat downwardly offset from Y axis. Switches SW1–SW6 are in a position connected to the contact at the side G. This position is for a sequence of driving the scribed area into its proper position. Since the scribed area is in a position somewhat downwardly offset as mentioned above, there is obtained from the logic level converting circuits $105_{L1}$–$105_{R2}$ a signal which corresponds to any one of signals (ii), (iii) and (iv) shown in FIG. 11. The signal obtained at this time point is delivered to AND circuits $107_L$ and $107_R$. As shown in detail in FIG. 10, the circuit is so designed that it takes up an AND at its AND gate A through a flip-flop $D_1$ which is reset whenever at least one pulse comes in every scanning and that its output signal is given to the discrimination circuit 111. The latter circuit 111 possesses five outputs A–E which are determined by the output logic of the AND circuit. A continues putting out a positive logic unit the scribed area enters at one of the right and left view fields. B puts out a positive logic until the scribed area enters the remaining view fields. C puts out a positive logic until the scribed area comes into the center of the two view fields, that is, into the scanning position of the laser beam, after returning the first entered scribed area and rotating it. D and E put out a direction discriminating signal respectively which is used for determining the direction of $\theta$. More particularly, D issues a negative pulse when the scribed area enters the center of the left view field (when the AND circuit issues a positive output). E issues a negative pulse when the scribed area enters the center of the right view field (when the AND circuit issues a positive output). In FIG. 13, these five signals are shown relative to movement of wafer with time.

When the sequence is started, there comes out signal of A which is transmitted to the Y forward direction pulse circuit 115 in which an AND of the signal and a signal coming from the pulse motor clock circuit 113 is made. The AND signal is put into the forward direction input terminal of Y motor driving circuit 119 which drives Y motor rotating through SW5. Therefore, so long as the signal of A appears the stage is continuously driven in Y forward direction.

Provided that the wafer is initially set in a position as shown in FIG. 13a, there will exist the output of A for the time period of $t_0$ to $t_1$. When $t=t_1$, the scribed area enters the center of the left view field. Upon this entrance of the scribed area, the output of the logic circuit $107_L$ becomes positive and therefore A of the discrimination circuit becomes a negative output. On the other hand, B becomes a positive output and at the direction criminating signal D there appears a negative pulse. The output of B is delivered to Y deviation amount counting circuit 116 which counts Y drive pulses until the scribed area enters the center of the remaining view field while sending the drive pulse to Y forward direction input terminal of the Y motor driving circuit 119. Therefore, the pulse motor YM is driven so as to continue driving the stage in Y forward direction. Thereby, the scribed area which entered first the left view field is somehow displaced upwardly offset from the view field center, but now the described area enters the center of the right view field. Let the time of this entrance in the right view field be $t_2$, then the number of drive pulses delivered for the time of $t_2-t_1$ corresponds to the deviation amount existing between the left scribed area and the right one, that is, to the amount of rotation. Therefore, Y axis is moved back by the amount of $\frac{1}{2}$ of the known deviation amount. The amount given by dividing the deviation by the distance between the two view fields corresponds to the component of rotation.

Figure 14:
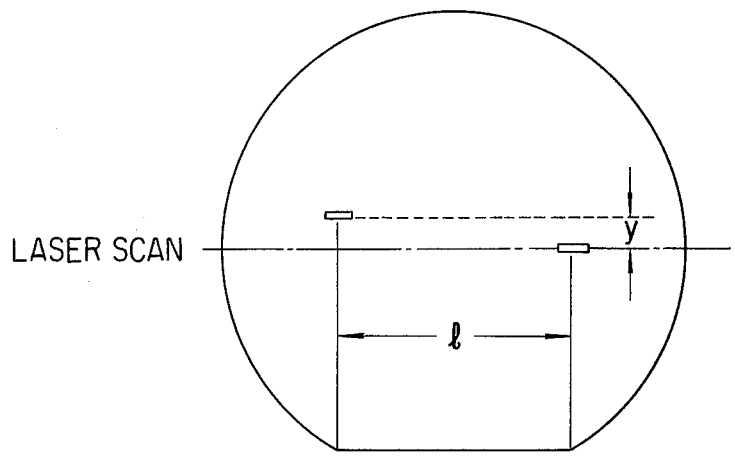
FIG. 14 is an explanatory view for explaining the operational formulae of movement amounts of translational movement mechanism shown in FIG. 5.

The above described relation is illustrated in FIG. 14. When $t=t_2$, the output of B of the discrimination circuit 111 turns negative and the output of the logic circuit 107$_R$ becomes positive in a similar manner to the above. Thus, Y forward driving is stopped and simultaneously the output of C of the circuit 111 becomes positive. Furthermore, $\frac{1}{2}$ of the drive count number counted in Y deviation amount counting circuit 116 are delivered to Y return amount counting circuit 117 and also the above said count number is delivered to the rotation amount ($\theta$) counting circuit 123. The circuit 117 delivers pulse motor-clocks to the backward input terminal of Y motor driving circuit 119, the number of clocks being equal to $\frac{1}{2}$ of the drive counts. At the same time, the circuit 123 delivers to the $\theta$ motor driving circuit 125 in accordance to the output of direction discrimination circuit 121 a number of rotation amount pulses the number of which is equal to the product of the above mentioned quotient (drive count number divided by distance between the two view fields) and a constant K. These clocks and pulses drive the pulse motors for Y and $\theta$ through SW5 and SW6 respectively. The direction discrimination circuit 121 may be embodied by using a set-reset type flip-flop. So, the state thereof can be determined by a later coming direction pulse (output from D, E of discrimination circuit 111).

When AND of pulse motor clock and C output of the discrimination circuit makes the count of Y return amount counting circuit 117 and the count of rotation amount ($\theta$) counting circuit 123 zero, the signal will be returned to the timing control circuit 141 so that the signal from the control circuit 141 will change the signal at C output terminal of discrimination circuit 111 into a negative one. This corresponds to the time of $t=t_3$ in FIG. 13. At this time point, the outputs of both the channels for the right and left view fields are positive, which means that the laser beam is scanning the scribed area at both the view fields. In this manner, the use of combination of two filters makes it possible to bring the scribed area of the wafer into a scan position of the laser beam.

Now, the apparatus is ready for alignment. Therefore, under the condition of $t=t_3$, the timing control circuit 141 acts to switch over SW1–SW6 from the side of G to H and to actuate the pulse counting and pulse interval counting circuits 109$_L$ and 109$_R$. The results of counting are delivered to X, Y and $\theta$ movement amount counting circuit 176 so as to obtain the amount of deviation each in the direction of X, Y and $\theta$, as to both the left and the right. The amount of deviations then obtained is delivered to X, Y, $\theta$ accurate position driving circuit 129 which drives each the stage for X, Y and $\theta$ to complete the alignment.

Amounts of movement of stage required for this alignment, $\Delta X$, $\Delta Y$ and $\Delta \theta$ are given by, $$\Delta X = \Delta X_L + \Delta X_R/2$$

$$\Delta Y = \Delta Y_L + \Delta Y_R/2$$

$$\Delta \theta = K \cdot (\Delta Y_L - \Delta Y_R)/l$$

wherein,
$\Delta X_R$, $\Delta X_L$, $\Delta Y_R$ and $\Delta Y_L$ are deviations in left (suffix "L") and right (suffix "R"),
K is a constant, and
$l$ is distance between two view fields; and
$\Delta X_L = (W_1 - W_2 - W_4 + W_5)/4$
$\Delta Y_L = (-W_1 + W_2 - W_4 + W_5)/4$ Even if the area scanned during the time period from $t=t_0$ to $t_2$ is not the scribed area but a blank portion, the discrimination circuit 111 will give a signal to each of its outputs as described above. In such case, the operator switches over SW1–SW4 by means of the timing control circuit when the output of AND circuit becomes positive (true) and measures the pulse number of mask and wafer. When the number is four, the operator can continue the sequence without any interruption.

The above described embodiment has such a disadvantage that when the component of $\theta$ is large, Y in FIG. 14 becomes large and therefore the time required for driving the stage becomes relatively long. This disadvantage will be obviated by the following procedure. After the scribed area has once entered the center of any one of the view fields, namely the laser beam scan position, the following Y forward direction driving to adjust the rotation of $\theta$ axis and the downward movement in Y axis direction occurring with the rotation is carried out while keeping the entered scribed area unmoved.

FIG. 15 shows various combinations of signals derived from the filters.

While in the above described embodiment, the discrimination of scribed line is made making use of the difference in distribution of scattered light between circuit pattern and alignment mark, it may be done in a different manner. For example, a pattern that is entirely different from the circuit pattern may be provided on the scribed line and a particular signal obtainable from the additional pattern may be used for detection of the position of the scribed line.

Figure 16A:
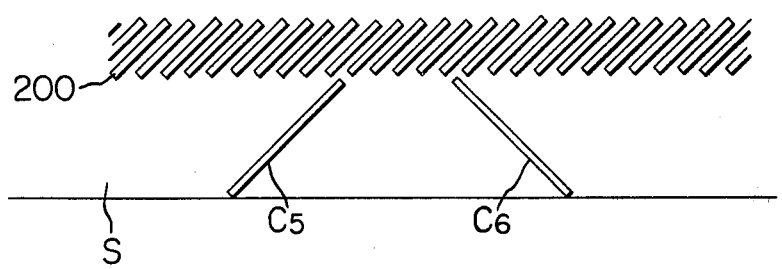
FIGS. 16A–16B is another embodiment of the invention in which a particular pattern in provided on a wafer to easily detect the scribed line.
Figure 16B:
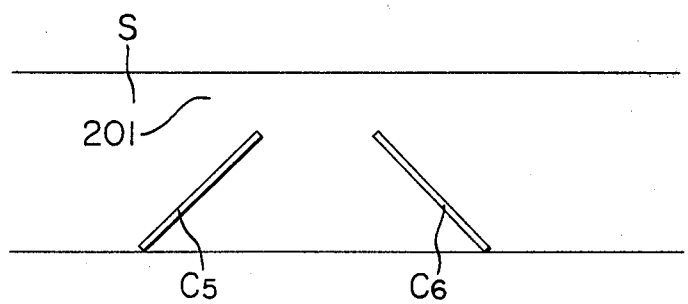

FIG. 16 illustrates a portion of scribed line or area on a wafer.

In the illustration (A) of FIG. 16, a particular pattern 200 is provided on the scribed line. In case of the illustration (B), there is provided a blank portion 201 of a predetermined width. When the laser beam scans the particular pattern 200, there is obtained a signal of very high frequency whereas for the particular blank 201 there occurs the state of zero signal which continues for a predetermined time. A predetermined time after these particular signals were obtained there comes out a signal that is a signal to scan the alignment mark.

What we claim is:

1. An apparatus for aligning a mask and a wafer comprising:
   a mask carrier for holding a mask having alignment marks provided in a narrow strip-like area existing between circuit patterns;
   a wafer carrier for holding a wafer having alignment marks provided in a narrow strip-like area existing between circuit patterns;
   photoelectric detecting means for scanning said mask and wafer along a scanning line;
   electric means for discriminating whether or not said narrow strip-like area on said mask and wafer is coincident with the scanning line and detecting relative displacement between the alignment marks of the mask and wafer;
   driving means responsive to said electric means for moving at least one of said carriers relative to the other, said driving means moving said at least one of said carriers in a direction crossing said scanning line until the narrow strip-like areas on the mask and wafer are coincident, and thereafter, moving at least one of said carriers until the alignment marks of the mask and wafer are in a predetermined relation.

2. An alignment apparatus as claimed in claim 1, wherein said photoelectric detecting means includes means capable of distinguishing the scattered light by said circuit pattern from the scattered light by said alignment mark so as to generate an output.

3. An alignment apparatus as claimed in claim 1, wherein said narrow strip-like area of said wafer has a predetermined particular pattern thereon which characterizes the existence of said alignment marks.

4. An alignment apparatus as claimed in claim 1, wherein said narrow strip-like areas on said mask and wafer are scribed lines.

5. An alignment apparatus as claimed in claim 1, wherein said scanning line is rectilinear.

6. An apparatus as claimed in claim 1, wherein said photoelectric detector means receives only scattered light from the wafer.

* * * * *

UNITED STATES PATENT AND TRADEMARK OFFICE
CERTIFICATE OF CORRECTION

PATENT NO. : 4,315,201
DATED : February 17, 1982
INVENTOR(S) : AKIYOSHI SUZUKI, ET AL.

It is certified that error appears in the above-identified patent and that said Letters Patent are hereby corrected as shown below:

In the Headnote, item [30], "54" should be --52--.

Column 1, line 63, after "establishment" insert --of--.

Column 6, line 63, "us" should read --use--.

Column 11, line 2, "criminating" should read --discriminating--.

Signed and Sealed this

Eleventh Day of May 1982

[SEAL]

Attest:

Attesting Officer

GERALD J. MOSSINGHOFF

Commissioner of Patents and Trademarks